United States Patent
Liu et al.

(10) Patent No.: US 9,968,007 B2
(45) Date of Patent: May 8, 2018

(54) RACK ASSEMBLY

(71) Applicant: NATIONAL CHIAO TUNG UNIVERSITY, Hsinchu (TW)

(72) Inventors: Yao-Hsien Liu, Taichung (TW); Sheng-Kai Chang, New Taipei (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 13 days.

(21) Appl. No.: 15/050,750

(22) Filed: Feb. 23, 2016

(65) Prior Publication Data

US 2017/0142866 A1    May 18, 2017

(30) Foreign Application Priority Data

Nov. 13, 2015  (TW) .............................. 104137429 A

(51) Int. Cl.
*H05K 7/20*    (2006.01)

(52) U.S. Cl.
CPC ..... *H05K 7/20736* (2013.01); *H05K 7/20145* (2013.01); *Y10S 165/908* (2013.01)

(58) Field of Classification Search
CPC ....... G06F 1/20; F28D 1/024; H05K 7/20145; H05K 7/20736
See application file for complete search history.

(56) References Cited

U.S. PATENT DOCUMENTS

| | | | | |
|---|---|---|---|---|
| 4,148,534 A * | 4/1979 | Veburg | ................... | G01R 31/02 174/16.1 |
| 4,851,965 A * | 7/1989 | Gabuzda | ............ | H05K 7/20154 165/908 |
| 5,063,476 A * | 11/1991 | Hamadah | .............. | H01L 23/467 257/E23.099 |
| 5,361,188 A * | 11/1994 | Kondou | ................ | H01L 23/467 165/104.34 |
| 6,765,796 B2 * | 7/2004 | Hoffman | ............ | H05K 7/20563 165/121 |
| 8,199,505 B2 | 6/2012 | Dede | | |
| 8,355,246 B2 * | 1/2013 | Linhares, Jr. | ...... | H05K 7/20736 312/223.1 |
| 8,593,815 B2 | 11/2013 | Claassen et al. | | |

(Continued)

OTHER PUBLICATIONS

N. Rasmussen, "Improving Rack Cooling Performance Using Airflow Management Blanking Panels," Schneider Electric—Data Center Science Center, White Paper 44, Rev. 4.

C. Kurkjian & J. Glass, "Air-Conditioning Design for Data Centers—Accommodating Current Loads and Planning for the Future," ASHRAE Transactions: Symposia, vol. 111, Part 2, 2005: p. 715-724.

(Continued)

*Primary Examiner* — Robert J Hoffberg
*Assistant Examiner* — Hung Dang
(74) *Attorney, Agent, or Firm* — Ohlandt, Greeley, Ruggiero & Perle, LLP

(57) ABSTRACT

A rack assembly includes a rack body and a jet generating device. The rack body is configured to hold a plurality of servers that are displaced from each other by a passageway. The jet generating device is disposed in the passageway and includes a partition wall, a proximal barrier, and a distal barrier. The partition wall is disposed to define an inflow path and an outflow path. When cooling air is drawn into the inflow path, the cooling air is blocked by the distal barrier such that the cooling air is forced to flow into the outflow path through internal ports of the partition wall to generate a plurality of cooling air jets, which impinge on and cool one of the servers.

9 Claims, 4 Drawing Sheets

(56) References Cited

U.S. PATENT DOCUMENTS

| | | | | |
|---|---|---|---|---|
| 8,867,207 B2* | 10/2014 | Wei | ................... | G06F 1/188 |
| | | | | 361/679.49 |
| 8,913,382 B2* | 12/2014 | Wang | ................ | H05K 7/1492 |
| | | | | 361/679.5 |
| 8,964,375 B2* | 2/2015 | Claassen | ............ | H05K 7/20736 |
| | | | | 312/223.1 |
| 2013/0260666 A1 | 10/2013 | Rodriquez et al. | | |
| 2013/0265713 A1* | 10/2013 | Crane | ................... | G06F 1/20 |
| | | | | 361/679.51 |
| 2014/0049907 A1* | 2/2014 | Wei | ................... | G06F 1/188 |
| | | | | 361/679.51 |
| 2014/0233179 A1 | 8/2014 | Davis et al. | | |
| 2014/0347817 A1 | 11/2014 | Joshi et al. | | |

OTHER PUBLICATIONS

Y. Furihata, H. Hayama, M. Enai, T. Mori and M. Kishita, "Improving the Efficiency of Cooling Systems in Data Centers Considering Equipment Characteristics," Telecommunications Energy Conference, 2004. INTELEC 2004. 26th Annual International, 2004: p. 32-37.

J. R. Guarino and P. Manno, "Characterization of Laminar Jet Impingement Cooling in Portable Computer Applications," IEEE Transactions on Components and Packaging Technologies, vol. 25, No. 3, Sep. 2002: p. 337-346.

K. Jambunathan, E Lai, M. A. Moss and B. L. Button, "A Review of Heat Transfer Data for Single Circular Jet Impingement," Int. J. Heat and Fluid Flow, vol. 13, No. 2, Jun. 1992: p. 106-115.

\* cited by examiner

RACK ASSEMBLY

CROSS-REFERENCE TO RELATED APPLICATION

This application claims priority from Taiwanese application no. 104137429, filed on Nov. 13, 2015.

FIELD

The disclosure relates to a rack assembly, more particularly to a rack assembly including a jet generating device by which servers stored in the rack assembly can be cooled in a more efficient manner.

BACKGROUND

In recent years, with the popularization of smart phones, the number of servers deployed in a data center is vastly increased. For steady operation of the servers, a computer room air conditioning (CRAC) system is used to keep the servers at a low temperature. As shown in FIG. 1, a server rack has a rack body 9 defining a storage space 90, and a plurality of servers 91 are disposed in the storage space 90 and held by the rack body 9. A passageway 93 is defined between two adjacent ones of the servers 91. Cooling air is drawn into the storage space 90 by a fan (not shown) and is directed to pass through the passageway 93 along an arrow (P) to cool the servers 91. However, the cooling of the servers 91 entails the consumption of significant power. Therefore, there is a need to improve the efficiency of the cooling of the servers 91.

SUMMARY

Therefore, an object of the disclosure is to provide a rack assembly including a jet generating device by which servers stored in the rack assembly can be cooled in a more efficient manner.

According to the disclosure, a rack assembly is used for storage of a plurality of servers each having top and bottom walls, and includes a rack body and a jet generating device. The rack body has therein a storage space extending in an upright direction, and is configured to hold the plurality of the servers in the storage space such that the servers are displaced from each other in the upright direction by a passageway which extends in a transverse direction transverse to the upright direction to terminate at an inlet and an outlet, and which is defined by the bottom wall of a first one of the servers and the top wall of a next one of the servers. The jet generating device includes at least one partition wall, at least one proximal barrier, and a distal barrier. The partition wall is disposed in the passageway and extends in the transverse direction to terminate at proximal and distal marginal edges which are adjacent to the inlet and the outlet, respectively. The partition wall divides the passageway into an inflow path and at least one outflow path disposed downstream of the inflow path. The partition wall has a plurality of internal ports each of which is disposed downstream of the inflow path and upstream of the outflow path. The proximal barrier extends from the proximal marginal edge toward one of the bottom wall of the first one of the servers and the top wall of the next one of the servers. The distal barrier extends from the distal marginal edge toward the other one of the bottom wall of the first one of the servers and the top wall of the next one of the servers. When cooling air is drawn into the inflow path through the inlet, the cooling air is blocked by the distal barrier such that the cooling air is forced to flow into the outflow path through the internal ports to generate a plurality of cooling air jets, which impinge on said one of the bottom wall of the first one of the servers and the top wall of the next one of the servers before flowing out through the outlet.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
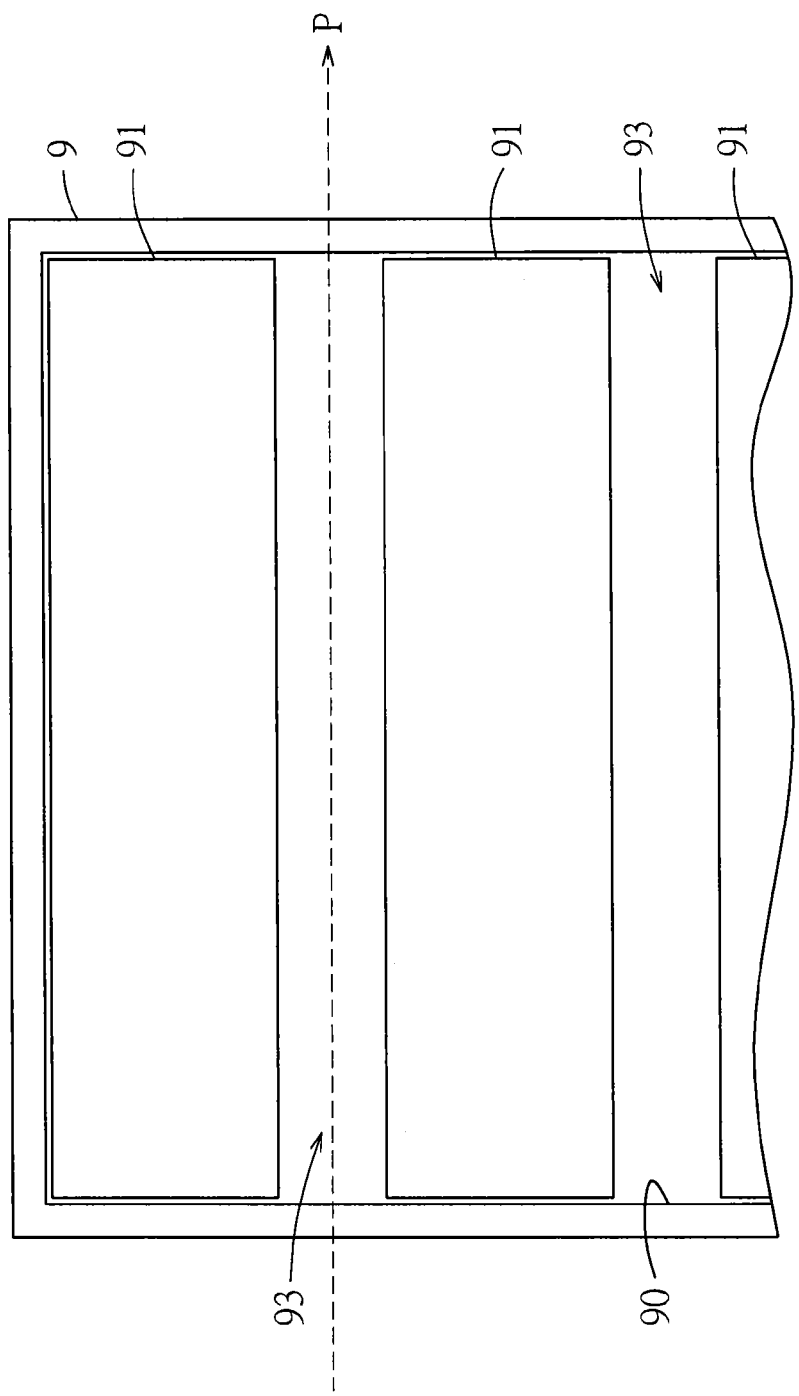
FIG. 1 is a schematic view of a conventional server rack.

Before the disclosure is described in greater detail, it should be noted that like elements are denoted by the same reference numerals throughout the disclosure.

Figure 2:
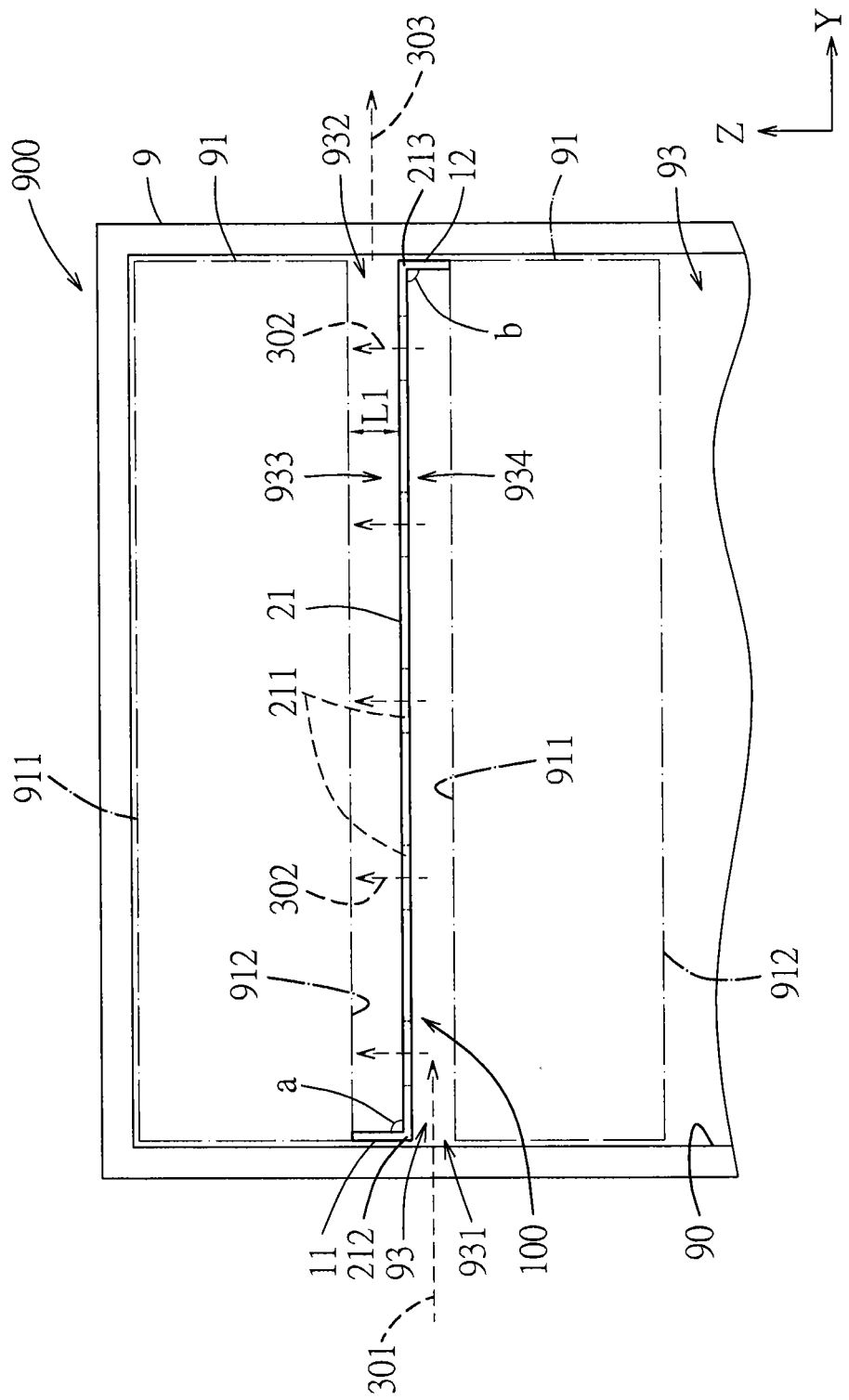
FIG. 2 is a schematic view of a rack assembly according to a first embodiment of the disclosure.

With reference to FIG. 2, a rack assembly 900 is used for storage of a plurality of servers 91 each having top and bottom walls 911, 912. The rack assembly 900 includes a rack body 9 and a jet generating device 100.

The rack body 9 has therein a storage space 90 extending in an upright direction (Z), and is configured to hold the plurality of servers 91 in the storage space 90 such that the servers 91 are displaced from each other in the upright direction (Z) by a passageway 93. The passageway 93 extends in a transverse direction (Y) transverse to the upright direction (Z) to terminate at an inlet 931 and an outlet 932, and is defined by the bottom wall 912 of a first one of the servers 91 and the top wall 911 of a next one of the servers 91.

In this embodiment, the rack body 9 is used to hold the servers 91 (e.g., blade servers). In other embodiments, the rack body 9 may be used to hold other computing devices, such as network equipment, power equipment, communication equipment, etc.

The jet generating device 100 includes at least one partition wall 21, at least one proximal barrier 11, and a distal barrier 12.

The partition wall 21 is disposed in the passageway 93 and extends in the transverse direction (Y) to terminate at proximal and distal marginal edges 212, 213 which are adjacent to the inlet 931 and the outlet 932, respectively. The partition wall 21 divides the passageway 93 into an inflow path 934 and at least one outflow path 933 disposed downstream of the inflow path 934. The partition wall 21 has a plurality of internal ports 211 each of which is disposed downstream of the inflow path 934 and upstream of the outflow path 933.

The proximal barrier 11 extends from the proximal marginal edge 212 toward one of the bottom wall 912 of the first one of the servers 91 and the top wall 911 of the next one of the servers 91. The distal barrier 12 extends from the distal marginal edge 213 toward the other one of the bottom wall 912 of the first one of the servers 91 and the top wall 911 of the next one of the servers 91.

In operation, for cooling the servers 91, cooling air (as indicated by dashed arrows 301, 302, 303) is driven into the storage space 90 by a fan (not shown). When the cooling air is drawn into the inflow path 934 through the inlet 931, the cooling air is blocked by the distal barrier 12 such that the cooling air is forced to flow into the outflow path 933 through the internal ports 211 to generate a plurality of cooling air jets, which impinge on said one of the bottom wall 912 of the first one of the servers 91 and the top wall 911 of the next one of the servers 91 before flowing out through the outlet 932. The heat generated by the first one of the servers 91 can be effectively transferred to the cooling air when the cooling air jets impinge on the bottom wall 912 of the first one of the servers 91.

In actual practice, a plurality of the jet generating devices 100 are disposed respectively in the passageways 93 defined among the servers 91. The heat generated by all of the servers 91 can be effectively transferred to the cooling air when the cooling air passes through all the passageways 90.

In this embodiment, as shown in FIG. 2, the proximal barrier 11 extends from the proximal marginal edge 212 to abut against the bottom wall 912 of the first one of the servers 91 so as to ensure that all the cooling air jets flow out of the outflow path 933 through the outlet 932. The distal barrier 12 extends from the distal marginal edge 213 to abut against the top wall 911 of the next one of the servers 91 so as to ensure that the cooling air flows into the outflow path 933 through the internal ports 211.

In addition, the partition wall 21 is spaced apart from the bottom wall 912 of the first one of the servers 91 by a distance (L1). When the distance (L1) ranges from 13 mm to 45 mm, better heat transfer between the cooling air and the bottom wall 912 of the first one of the servers 91 can be achieved.

The proximal barrier 11 and the partition wall 21 define therebetween a first included angle (a), which may be a right angle, an acute angle, or an obtuse angle. The distal barrier 12 and the partition wall 21 define therebetween a second included angle (b), which may be a right angle, an acute angle, or an obtuse angle. In this embodiment, each of the first and second included angles (a, b) is a right angle.

In this embodiment, the internal ports 211 respectively have cross-sectional areas. A sum of the cross-sectional areas of the internal ports 211 is in a range from 1.5% to 20% based on a major surface area of the partition wall 21.

Figure 3:
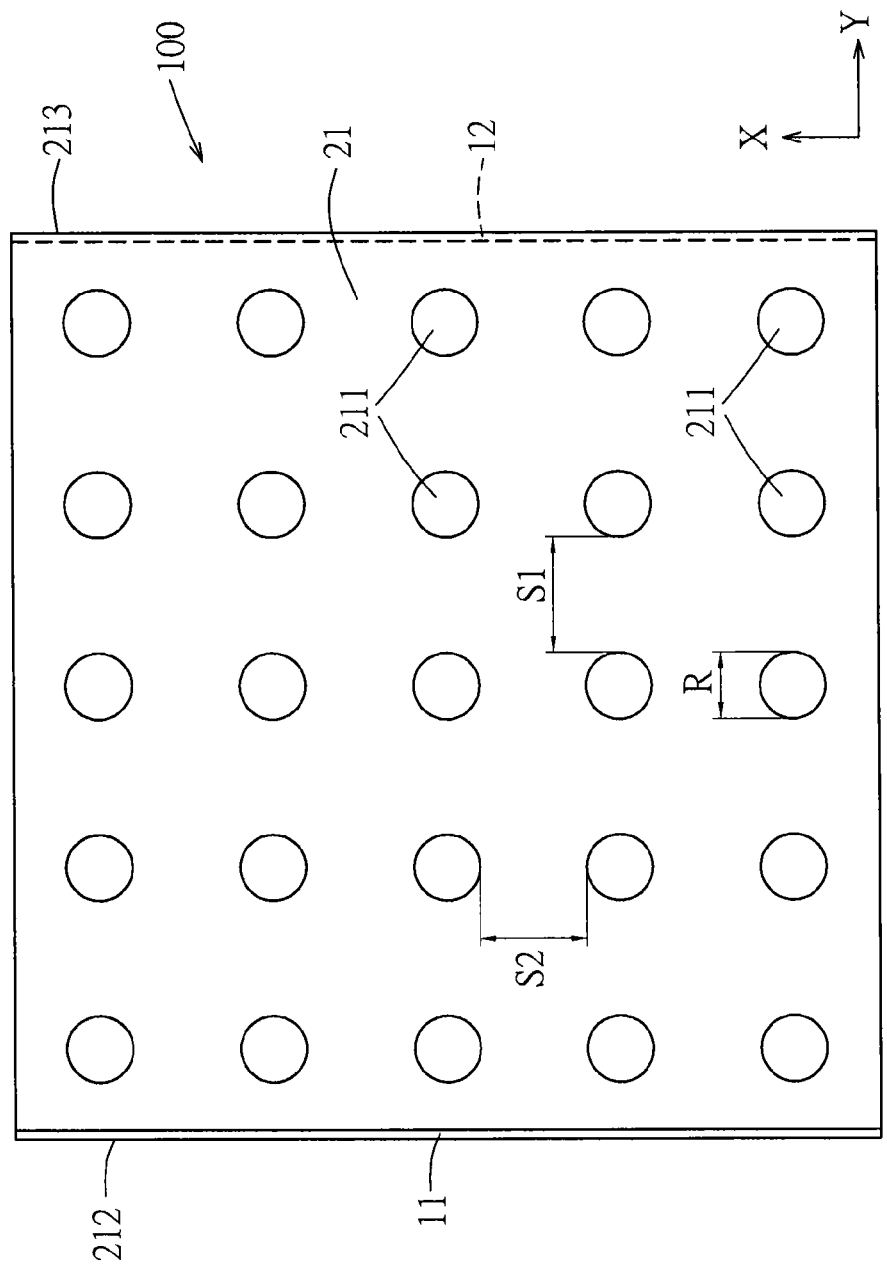
FIG. 3 is a plan view of a partition wall of the rack assembly of FIG. 2.

With reference to FIG. 3, the partition wall 21 has twenty-five internal ports 211 each having a diameter (R). The internal ports 211 are displaced from each other in the transverse direction (Y) by a first predetermined distance (S1), and are displaced from each other in a longitudinal direction (X) by a second predetermined distance (S2). The longitudinal direction (X) is transverse to both of the upright direction (Z) and the transverse direction (Y). Each of the first and second predetermined distances (S1, S2) is two to eight times the diameter (R). In this embodiment, each of the first and second predetermined distances (S1, S2) is two times the diameter (R).

Figure 4:
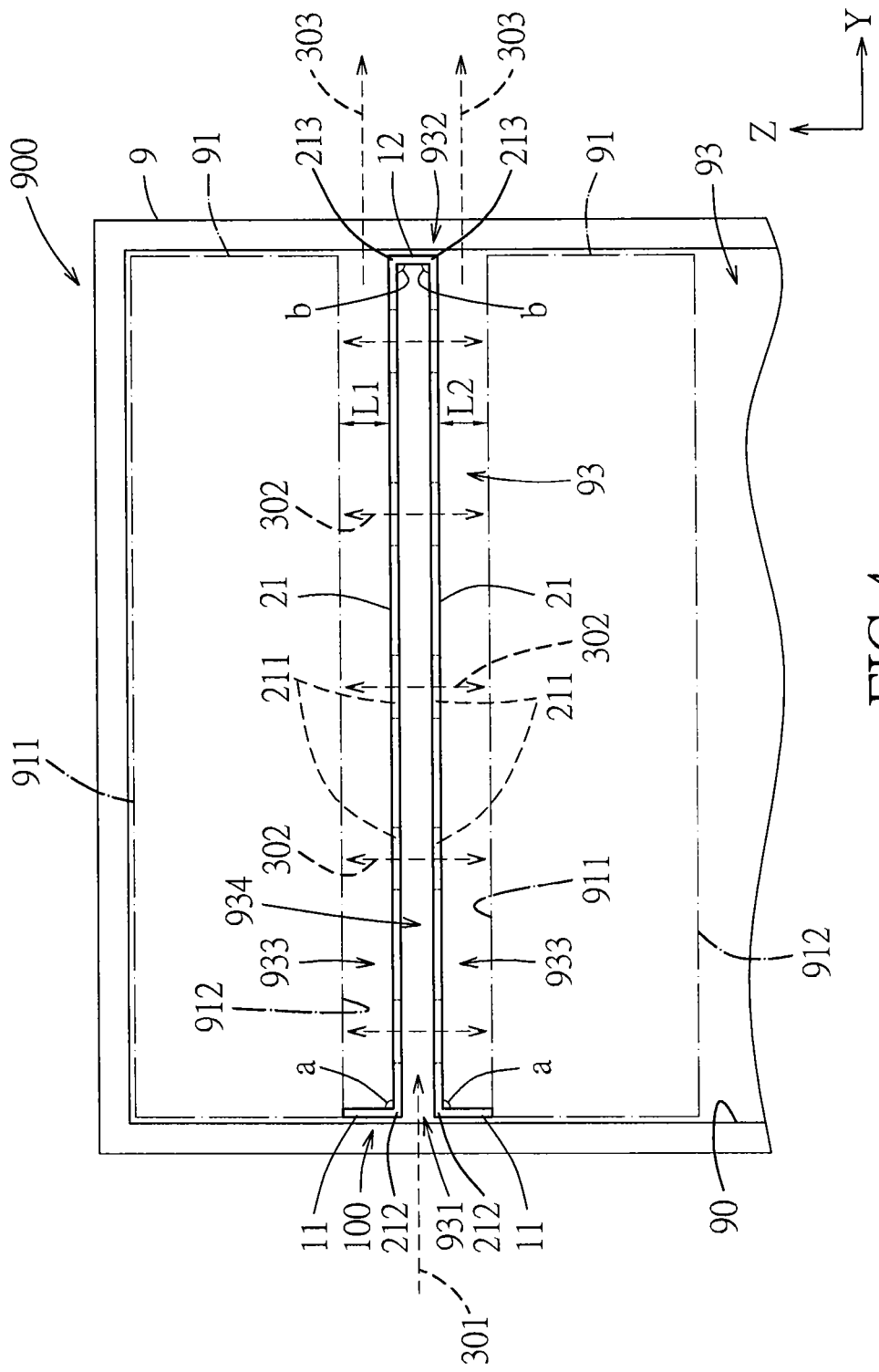
FIG. 4 is a schematic view of a rack assembly according to a second embodiment of the disclosure.

FIG. 4 shows a rack assembly according to a second embodiment of the disclosure. The second embodiment is similar to the first embodiment except that the jet generating device 100 includes two partition walls 21 and two proximal barriers 11.

The partition walls 21 are spaced apart from each other in the upright direction (Z) in the passageway 93 to define the inflow path 934 therebetween. The partition walls 21 are respectively spaced apart from the bottom wall 912 of the first one of the servers 91 and the top wall 911 of the next one of the servers 91 to define two of the outflow paths 933, respectively.

The proximal barriers 11 extend away from each other and respectively from the proximal marginal edges 212 of the partition walls 21 to abut against the bottom wall 912 of the first one of the servers 91 and the top wall 911 of the next one of the servers 91, respectively, such that all the cooling air jets flow out of the outflow paths 933 through the outlet 932.

The distal barrier 12 extends from the distal marginal edge 213 of one of the partition walls 21 to connect with the distal marginal edge 213 of the other one of the partition walls 21 so as to force the cooling air to flow into the outflow paths 933 through the internal ports 211 of the partition walls 21.

In this embodiment, the cooling air flows into the outflow paths 933 to generate a plurality of cooling air jets, which impinge on the bottom wall 912 of the first one of the servers 91 and the top wall 911 of the next one of the servers 91.

Furthermore, the upper partition wall 21 is spaced apart from the bottom wall 912 of the first one of the servers 91 by a distance (L1) ranging from 13 mm to 45 mm, and the lower partition wall 21 is spaced apart from the top wall 911 of the next one of the servers 91 by a distance (L2) ranging from 13 mm to 45 mm.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A rack assembly for storage of a plurality of servers each having a top and a bottom walls, said rack assembly comprising:
   a rack body which has therein a storage space extending in an upright direction, and which is configured to hold the plurality of the servers in said storage space such that the servers are displaced from each other in the upright direction by a passageway which extends in a transverse direction transverse to the upright direction to terminate at an inlet and an outlet, and which is defined by the bottom wall of a first one of the servers and the top wall of a next one of the servers; and
   a fluid generating device including
      at least one partition wall which is disposed in said passageway and which extends in the transverse direction to terminate at proximal and distal marginal edges which are adjacent to said inlet and said outlet, respectively, said partition wall dividing said passageway into an inflow path and at least one outflow path disposed downstream of said inflow path, said partition wall having a plurality of internal ports each of which is disposed downstream of said inflow path and upstream of said outflow path,
      at least one proximal barrier extending from said proximal marginal edge toward one of (1) the bottom wall of the first one of the servers and (2) the top wall of the next one of the servers, and
      a distal barrier extending from said distal marginal edge toward the other one of (1) the bottom wall of the first one of the servers and (2) the top wall of the next one of the servers, whereby
   when cooling air is drawn into said inflow path through said inlet, the cooling air is blocked by said distal barrier such that the cooling air is forced to flow into said outflow path through said internal ports to generate a plurality of cooling air jets, which impinge on said one of the bottom wall of the first one of the servers and the top wall of the next one of the servers before flowing out through said outlet, wherein said proximal barrier extends from said proximal marginal edge to abut against one of (1) the bottom wall of the first one of the servers and (2) the top wall of the next one of the servers so as to ensure that the plurality of cooling air jets flow out of said outflow path through said outlet.

2. The rack assembly according to claim 1, wherein said internal ports respectively have cross-sectional areas, a sum of said cross-sectional areas being in a range from 1.5% to 20% based on a major surface area of said partition wall.

3. The rack assembly according to claim 2, wherein said internal ports are displaced from each other in the transverse direction by a first predetermined distance.

4. The rack assembly according to claim 3, wherein said internal ports are displaced from each other in a longitudinal direction by a second predetermined distance, the longitudinal direction being transverse to both of the upright direction and the transverse direction.

5. The rack assembly according to claim 4, wherein each of said internal ports has a diameter, each of said first and second predetermined distances being two to eight times said diameter.

6. The rack assembly according to claim 1, wherein said proximal barrier extends from said proximal marginal edge to abut against the bottom wall of the first one of the servers so as to ensure that all the cooling air jets flow out of said outflow path through said outlet.

7. The rack assembly according to claim 6, wherein said distal barrier extends from said distal marginal edge to abut against the top wall of the next one of the servers so as to ensure that the cooling air flows into said outflow path through said internal ports.

8. The rack assembly according to claim 7, wherein said partition wall is spaced apart from the bottom wall of the first one of the servers by a distance ranging from 13 mm to 45 mm.

9. The rack assembly according to claim 1, wherein said fluid generating device includes
- two of said partition walls, which are spaced apart from each other in the upright direction in said passageway to define said inflow path therebetween, and which are respectively spaced apart from the bottom wall of the first one of the servers and the top wall of the next one of the servers to define two of said outflow paths, respectively,
- two of said proximal barriers which extend away from each other and respectively from said proximal marginal edges of said partition walls to abut against the bottom wall of the first one of the servers and the top wall of the next one of the servers, respectively such that all the cooling air jets flow out of said outflow paths through said outlet, and
- said distal barrier extending from said distal marginal edge of one of said partition walls to connect with said distal marginal edge of the other one of said partition walls so as to force the cooling air to flow into said outflow paths through said internal ports of said partition walls.

* * * * *